US006569580B2

(12) United States Patent
Campi et al.

(10) Patent No.: US 6,569,580 B2
(45) Date of Patent: May 27, 2003

(54) BINARY AND PHASE-SHIFT PHOTOMASKS

(75) Inventors: Jim G. Campi, Morgan Hill, CA (US); Douglas J. Van Den Broeke, Sunnyvale, CA (US)

(73) Assignee: Diverging Technologies, Inc., Morgan Hill, CA (US)

( * ) Notice: Subject to any disclaimer, the term of this patent is extended or adjusted under 35 U.S.C. 154(b) by 0 days.

(21) Appl. No.: 09/809,733

(22) Filed: Mar. 13, 2001

(65) Prior Publication Data

US 2003/0022072 A1 Jan. 30, 2003

(51) Int. Cl.$^7$ ................................................ G03F 9/00
(52) U.S. Cl. ........................................................ 430/5
(58) Field of Search ........................... 430/5, 322, 323, 430/324; 378/34, 35

(56) References Cited

U.S. PATENT DOCUMENTS

| | | | | |
|---|---|---|---|---|
| 4,068,018 A | * | 1/1978 | Hashimoto et al. ............ 427/38 |
| 4,321,317 A | | 3/1982 | MacIver ........................ 430/5 |
| 4,374,911 A | * | 2/1983 | Hartley ........................ 430/5 |
| 4,410,611 A | | 10/1983 | MacIver ........................ 430/5 |
| 4,554,208 A | | 11/1985 | MacIver et al. ............ 428/332 |
| 4,647,512 A | | 3/1987 | Venkataramanan et al. . 428/688 |
| 4,693,760 A | | 9/1987 | Sioshansi ........................ 148/4 |
| 4,743,493 A | | 5/1988 | Sioshansi et al. ............ 428/217 |
| 4,806,442 A | * | 2/1989 | Shirasaki et al. .............. 430/4 |
| 4,885,231 A | * | 12/1989 | Chan .......................... 430/321 |
| 4,890,309 A | | 12/1989 | Smith et al. .................... 388/35 |
| 4,987,007 A | | 1/1991 | Wagal et al. ............... 427/53.1 |
| 5,079,113 A | * | 1/1992 | Ohta et al. ....................... 430/5 |
| 5,133,757 A | | 7/1992 | Sioshansi et al. ............. 623/18 |
| 5,153,083 A | * | 10/1992 | Garofalo et al. ................ 430/5 |
| 5,171,607 A | | 12/1992 | Cumbo ........................ 427/570 |
| 5,208,125 A | | 5/1993 | Lowrey et al. ................ 430/22 |
| 5,217,830 A | * | 6/1993 | Lowrey ........................... 430/5 |
| 5,219,686 A | * | 6/1993 | Kamon ............................ 430/5 |
| 5,225,035 A | * | 7/1993 | Rolfson ....................... 156/643 |
| 5,229,230 A | * | 7/1993 | Kamon ............................ 430/5 |
| 5,391,407 A | | 2/1995 | Dearnaley .................... 427/527 |
| 5,391,510 A | | 2/1995 | Hsu et al. ...................... 427/44 |
| 5,393,572 A | | 2/1995 | Dearnaley ................... 427/523 |
| 5,411,824 A | * | 5/1995 | Vasudev et al. ................ 430/5 |
| 5,455,081 A | | 10/1995 | Okada et al. ................ 427/528 |
| 5,482,602 A | | 1/1996 | Cooper et al. ........... 204/192.1 |
| 5,512,330 A | | 4/1996 | Dearnaley ................... 427/525 |
| 5,516,884 A | | 5/1996 | Bianconi ..................... 528/397 |
| 5,559,367 A | | 9/1996 | Cohen et al. .................. 257/77 |
| 5,616,179 A | | 4/1997 | Baldwin et al. ............ 117/108 |
| 5,658,470 A | | 8/1997 | Schultz et al. ................ 216/22 |
| 5,674,355 A | | 10/1997 | Cohen et al. ............. 156/652.1 |
| 5,679,269 A | | 10/1997 | Cohen et al. .................. 216/72 |
| 5,731,045 A | | 3/1998 | Dearnaley et al. .......... 427/527 |
| 5,780,119 A | | 7/1998 | Dearnaley et al. .......... 427/528 |
| 5,852,303 A | | 12/1998 | Cuomo et al. .................. 257/9 |
| 5,857,882 A | | 1/1999 | Pam et al. ....................... 445/5 |
| 5,858,477 A | | 1/1999 | Veerasamy et al. ......... 427/562 |
| 5,965,216 A | | 10/1999 | Neuberger et al. .......... 427/577 |
| 6,506,526 B2 | * | 1/2003 | Stivers et al. ................... 430/5 |

OTHER PUBLICATIONS

Donald Osias and Donald Shernock, "Ion Beams for Photomask Repair and Fabrication", *Bacus, 1984*, pp. 31–34.
Akihiro Nitayama, et al., "New Phase Shifting Mask with Self–Aligned Phase Shifters for a Quarter Micron Photolithography", *Technical Digest*, Dec. 3–6, 1989, Pgs. 3.31–3.3.4.
Van Den Broeke, Douglas, "Transferring Phase–Shifting Mask Technology into Mainstream Manufacturing", pp. 1–6; Nov. 19, 2000.
Brunner, T.A., "Impact of lens aberrations on optical lithography", *Journal of Research & Development, vol. 41, No/ ½—Optical lithography*.

* cited by examiner

Primary Examiner—Stephen D Rosasco
(74) *Attorney, Agent, or Firm*—Bernard F. Rose, Esq.; Bingham McCutchen LLP

(57) ABSTRACT

The present invention relates to photomasks for use in semiconductor chip manufacture.

28 Claims, 6 Drawing Sheets

BINARY AND PHASE-SHIFT PHOTOMASKS

The present invention relates to the physics, material science, optics, lithography and semiconductor chip manufacture. In particular, it relates to photomasks for use in semiconductor chip manufacture.

BACKGROUND OF THE INVENTION

One of the driving forces of technology today is the desire to produce smaller and smaller devices, which, while being smaller, have the same or even greater operating characteristics as their larger version. No place is this more evident than in the area of semiconductor manufacture. Devices on semiconductors are constantly being reduced in size to the point that sub-micron architecture is becoming commonplace and circuit densities in the millions of transistors per die are the norm. To accomplish this, smaller and smaller feature sizes, a feature being an element of the device such as a lines, holes and corners and edges of surface structures, are required. While numerous techniques for the manufacture of these infinitesimal devices are being tested in the laboratory and even more are being proposed, the mainstay of the semiconductor manufacturing industry remains lithography, primarily optical photolithography.

Optical photolithography requires four basic components, an illumination device, which modernly can provide light of a very narrow range of, even essentially a single, wavelength, a photomask on which an image of the device to be created on a wafer is projected several times larger than the eventual device on the wafer, an optical system which reduces the size of the image and focuses it on the wafer surface, and the wafer itself. The optical resolution obtainable in a photolithography system is constrained by each of the first three parameters. That is, wavelength of the light used, the physical condition of the mask, i.e., whether it contains any defects and the ability of the mask to direct light to the lens with minimum diffraction and the ability of the lens to focus the image on the wafer. Presently, the wavelength of light is selectable and controllable at almost any wavelength from that of visible light (400–700 nanometers (nm)) to that of the extreme uv region of the spectrum (approximately 5 to 254 nm). The capabilities of the lens is characterized by its numerical aperture (NA), which correlates with the ability of a lens to collect and use diffracted light from a source (the more diffraction orders that can be collected, the more information available to form an image and, thus, the greater the resolving power of the lens) has been greatly improved and may be approaching a practical maximum. As control over light sources and lenses has advanced, advances in photomasks have not entirely kept pace. Even the newest generation of photomasks still retain several characteristics that contribute heavily to reduced optical resolution and for which optimal control or correction means are still being sought.

One problem with photomasks is their physical integrity. Pinholes in the material forming the dark areas of the mask (usually sputtered metallic chromium, although such materials as aluminum and molybdenum silicide are also being used) can result in the printing of errant features on a wafer. And, while the materials forming the dark areas of the mask are generally quite hard, they are also very thin and subject to physical damage during use, especially when used in contact mode. Another problem with photomasks is diffraction of light passing though the mask at the boundaries between opaque and transparent regions of the mask which ultimately causes broadening of line widths and blurring of other structural features resulting in reduced resolution on a wafer.

A technique devised for controlling light diffraction at the boundary between opaque and transparent portions of a photomask is phase-shift lithography. Phase-shift masks (PSMs) make use of the phenomenon of wave interference. That is, the phase of the light used to expose a substrate through a PSM is controlled such that light passing through adjacent light-transmitting regions of the mask are out of phase with one another, most often by 180°, although other phase differentials may be used for certain purposes. The result of a 180° phase differential is the creation of a dark line between the adjacent light-transmitting regions due to destructive interference between the out-of-phase light waves. The PSMs currently receiving the most attention are alternating PSMs, rim PSMs and attenuated PSMs. The alternate PSM (FIG. 1A), is most useful for closely spaced densely packed patterns. The rim PSM (FIG. 1B) and attenuated PSM (FIG. 1C) are more effective with random patterns of lines and holes and other structural features. The utility of the rim PSM suffers somewhat from the fragility of the overhang portion of the mask and both the rim and attenuated PSMs are limited by the requirement that the phase shifting material be of a certain thickness based on its refractive index and the wavelength of the light being shifted in order to achieve a desired degree of phase shift (Eq. 1, below).

A further problem faced with present masks is the mask error factor (MEF). The MEF is defined as ratio of the actual error in a critical feature size printed on a wafer to the error in size of the feature predicted by the feature size error on the mask and the reduction factor. For example, assuming a critical feature that is designed to be 1.0 micron on the wafer and a 4× reduction from mask to wafer and that the critical feature on the photomask measures 4.04 microns (instead of the ideal size of 4.00 microns). The 40 micron error in the critical feature dimension on the mask would be expected to give a 10 micron error (4× reduction) on the wafer, that is, a feature measuring 1.01 microns. However, due to non-linear behaviour of the wafer lithography process, the resulting feature size may in fact be, for example, 1.02 microns, that is, a 20 micron error. The MEF then would be 2 (20÷10), indicating that the critical dimension error that was printed on the wafer was 2× larger than that predicted based on the error in the mask and the reduction factor. The MEF becomes significant in the realm of sub-wavelength lithography where the geometry, that is, the critical features, being imaged are smaller than the wavelength of the light used to expose the pattern on the wafer.

What is needed is a mask that is physically stronger than those presently available, that has better resolution, a reduced MEF and, in the case of PSMs, greater flexibility with regard to phase-shift and transmission.

The present invention provides masks that meet these needs.

SUMMARY OF THE INVENTION

Thus, in one aspect, the present invention relates to a binary mask having energy-transmitting regions and energy-blocking regions, comprising an energy-transparent substrate, an energy-blocking substance adhered to the substrate in the energy-blocking regions and diamond-like carbon (DLC) adhered to the energy-blocking substance.

In another aspect, the present invention relates to a binary mask wherein the energy being used is visible light, uv light or x-ray energy.

In another aspect, the present invention relates to a binary mask wherein the energy being used is accelerated electrons.

In another aspect, the present invention relates to a binary mask wherein the energy is visible or uv light and the energy-transparent substrate comprises a glass.

In another aspect, the present invention relates to a binary mask where the energy is visible or uv light and the glass is fused quartz.

In another aspect, the present invention relates to a binary mask wherein the energy is accelerated electrons and the energy-transparent substrate comprises a silicon membrane.

In another aspect, the present invention relates to a binary mask wherein the energy is visible or uv light and the energy-blocking substance comprises a metal, a metal oxide, a metal nitride or a metal fluoride.

In another aspect, the present invention relates to a binary mask wherein the energy-blocking substance comprises chromium.

In another aspect, this present invention relates to a binary mask wherein said energy-blocking substance comprises chromium and metallic molybdenum, molybdenum oxide, molybdenum nitride or molybenum silicide.

In another aspect, the present invention relates to a binary mask wherein edges of the energy-blocking substance and edges of the DLC are in register and together provide lines of demarcation between the energy-transmitting regions and the energy-blocking regions of the mask.

In another aspect, the present invention relates to a binary mask wherein edges of the DLC provide lines of demarcation between the energy-transmitting and the energy-blocking regions and the edges of the energy-blocking substance are recessed relative to the edges of said DLC.

In another aspect, this invention relates to a binary mask wherein the DLC has undergone secondary ion-implantation to reduce transmission of energy.

In another aspect, the present invention relates to a binary mask wherein the DLC contains shrink-control slots that are sub-resolution to the imaging system being used and which are located in the DLC essentially parallel to the lines of demarcation between energy-transmitting and energy-blocking regions of the mask.

In another aspect, the present invention relates to a phase-shift mask having energy-transmitting regions and energy-blocking regions, comprising an energy-transparent substrate, a first energy-blocking substance adhered to said substrate in the energy-blocking regions and a second energy-blocking substance adhered to the first energy-blocking substance, wherein the edges of the first and the second energy-blocking substances are in register and together provide lines of demarcation between the energy-transmitting the energy-blocking regions of the mask, the first and the second energy-blocking substances independently transmit from about 0% to about 100% of energy incident on them and independently phase-shift energy that does pass through them from about 0° to about 360° relative to energy passing through the energy-transmitting regions of the mask; and, combined, the first and the second energy-blocking substances transmit from about 4% to about 60% of energy incident on them and phase-shift energy that does pass through them from about 0° to about 360° relative to energy passing through the energy-transmitting regions of the mask.

In another aspect, this invention relates to a phase-shift mask wherein the first energy-blocking substance comprises chromium.

In another aspect, this invention relates to a phase-shift mask wherein the second energy-blocking substance comprises diamond-like carbon (DLC).

In another aspect, this invention relates to a phase-shift mask wherein the DLC contains shrink-control slots that are sub-resolution to an imaging system being used and which are located in the DLC essentially parallel to the lines of demarcation between energy-transmitting and energy-blocking regions of the mask.

In another aspect, the present invention relates to a phase-shift mask further comprising ion-implantation of the substrate in the transparent regions of the mask wherein the ion-implanted substrate phase-shifts energy passing through it from about 0° to about 360° relative to energy passing through the combination of the first and second energy-blocking substances.

In another aspect, the present invention relates to a phase-shift mask wherein the substrate has undergone ion implantation resulting in a phase-shift of energy passing through it of about 180° relative to energy passing through the combination of the first and second energy-blocking substances.

In another aspect, this invention relates to a phase-shift mask wherein an ion-implanted substrate comprises ion-implanted quartz, ion-implanted calcium fluoride or ion-implanted magnesium fluoride.

In another aspect, this invention relates to a phase-shift mask having energy-transmitting regions and energy-blocking regions, comprising an energy-transparent substrate, a first energy-blocking substance adhered to the substrate in the energy-blocking regions and a second energy-blocking substance adhered to the first energy-blocking substance. The edges of the second energy-blocking substance provide lines of demarcation between the energy-transmitting and the energy-blocking regions of the mask. The edges of the first energy-blocking substance are recessed relative to the edges of the second energy-blocking substance. The first energy-blocking substance transmits from about 0% to about 100% of light incident on it, the second energy-blocking substance transmits from about 4% to about 100% of the energy incident on it and phase-shifts energy that passes through it from about 0° to about 360° relative to energy passing through the energy-transmitting region of the mask.

In another aspect, the present invention relates to a phase-shift mask wherein the second energy-blocking substance comprises diamond-like carbon (DLC).

In another aspect, the present invention relates to a phase-shift mask wherein the second energy-blocking substance comprises DLC which has undergone secondary ion-plantation.

In another aspect, the present invention relates to a phase-shift mask wherein the DLC has shrink-control slots in it that are sub-resolution to an imaging system being used and are located essentially parallel to the lines of demarcation between energy-transmitting and energy-blocking regions of the mask.

In another aspect, the present invention relates to a phase-shift mask wherein energy is increasingly phase-shifted as it passes through the second energy-blocking region the further it is from the lines of demarcation separating the energy-transmitting and the energy blocking regions of the mask.

In another aspect, the present invention relates to the phase-shift mask described immediately above wherein the thickness of the second energy-blocking increases the farther it gets from the lines of demarcation separating the energy-transmitting and the energy blocking regions of the mask.

Finally, an aspect of the present invention relates to a phase-shift mask wherein the second energy blocking substance comprises diamond-like carbon (DLC).

DETAILED DESCRIPTION OF THE INVENTION

DEFINITIONS

Figure 1A:
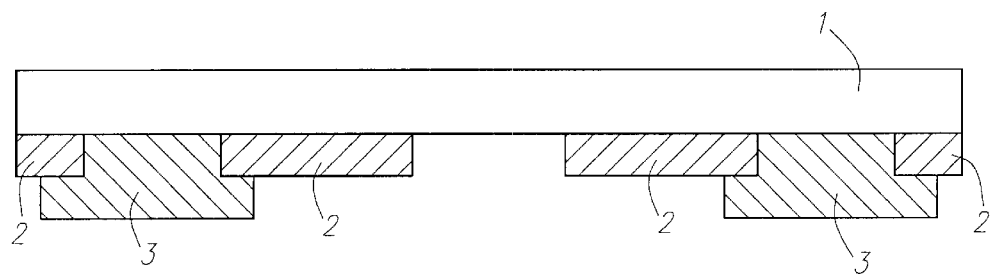
FIG. 1 is a schematic representation of several presently existing types of phase-shift masks (PSMs).
Figure 1B:
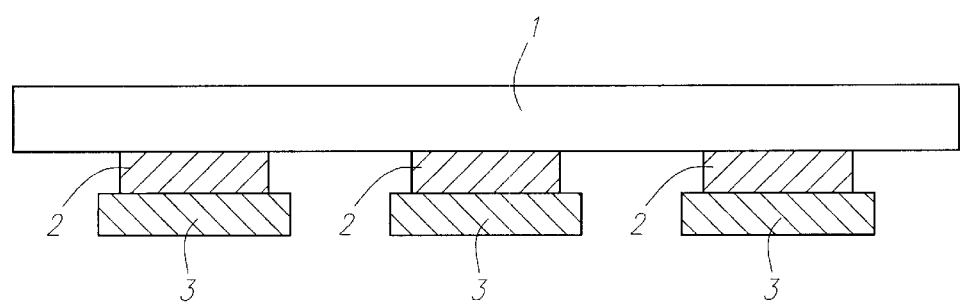
Figure 1C:
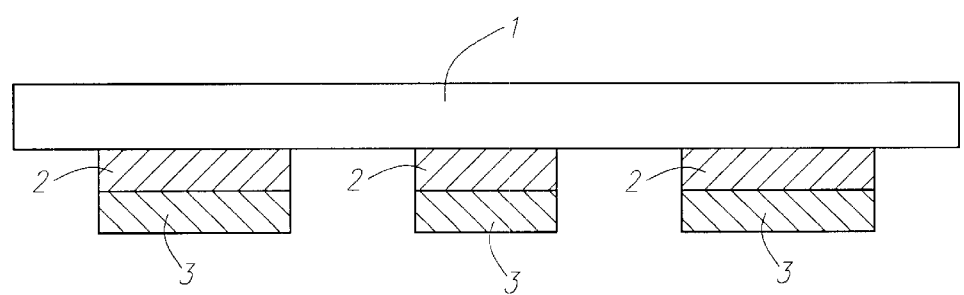
Figure 2A:
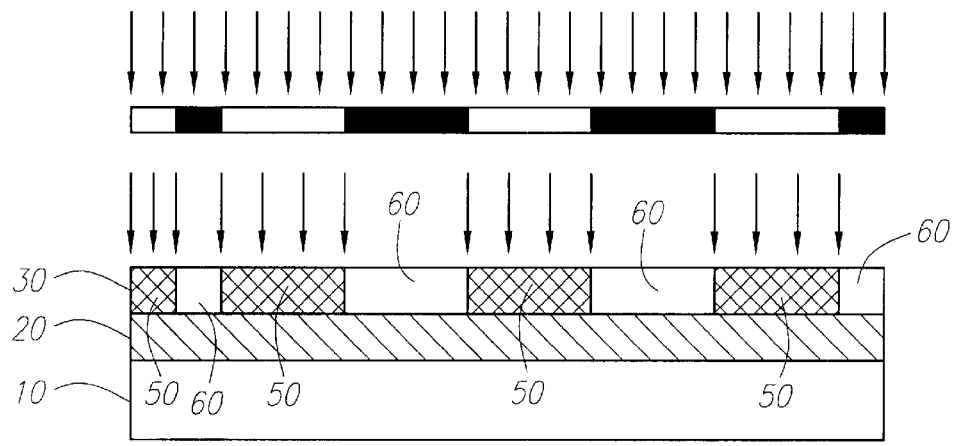
FIG. 2 is a schematic representation of a prior art binary photomask.
Figure 2B:
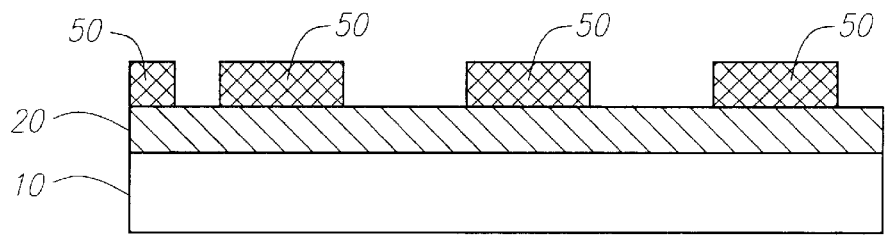
Figure 2C:
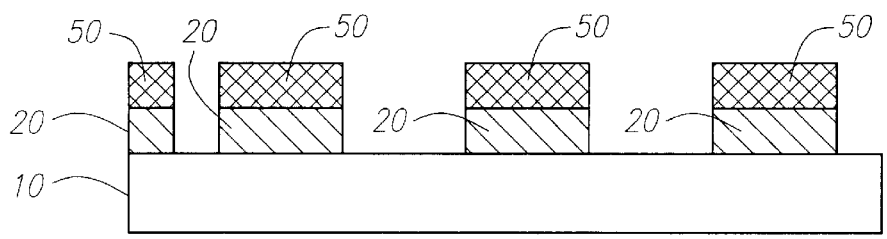
Figure 2D:
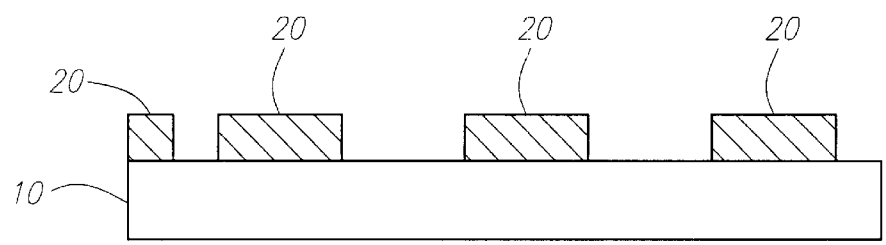

As used herein, a "mask" refers to a pattern that is superimposed on a transparent surface and which is to be projected onto a substrate, usually a silicon wafer. The pattern may be a "clear field" image, which in light photolithography terms would be called a "positive" image or it may "dark field", which in light photolithography terms would be called a negative. When visible light is used to transfer an image to a wafer, the mask used is often referred to as a "photomask." Another term which is synonymous with mask is "reticle."

As used herein, "energy-transmitting regions" of a mask are those regions through which incident energy is allowed to pass essentially unattenuated.

As used herein, "energy-blocking regions" of a mask are those regions which attenuate incident energy. The attenuation may be essentially complete, as in the case of a binary mask, or it may be partial, which is the case with a phase-shift mask.

As used herein, an "energy-transparent substrate" refers to a characteristic of the material on which a pattern is superimposed, namely, that the material in or and of itself will permit all of the particular type of incident energy to pass through essentially unattenuated. Examples, without limitation, of energy transparent substrates include borosilicate glass, which is transparent to visible wavelength light but attenuates ultraviolet (uv) light; fused quartz, which transmits both visible and uv wavelength light and a silicon nitride membrane, which is opaque to both visible and uv light but is transparent to an accelerated electron beam, that is electrons pass thought it essentially unattenuated.

As used herein, a "binary mask" refers to an image patterned on a transparent surface wherein the amount of energy allowed to pass through the energy-transmitting and energy-blocking regions of the pattern is binary. That is, energy incident on energy-transmitting regions of the pattern passes through essentially unattenuated while energy incident on energy-blocking regions of the pattern is essentially completely attenuated, that is, none passes through.

As used herein, a "phase-shift" mask refers an image patterned on a transparent surface wherein energy incident on an energy-blocking region of the imaged pattern is only partially attenuated, that is some energy passes through. While, depending on the application, energy may be permitted to pass through the energy-blocking regions anywhere within the energy-blocking region, the most common locus for partial attenuation of incident light in an energy-blocking region is at lines of demarcation between energy-transmitting and the energy-blocking regions of the mask. The energy that is permitted to pass through the partially energy-blocking region at the lines of demarcation is phase-shifted relative to the energy that passes through the adjacent energy-transmitting regions of the mask.

As used herein, an "energy-blocking substance" refers to a material that attenuates energy incident on it. The degree of attenuation caused by the energy-blocking substance may range from minimal to essentially total. Examples of energy-blocking substances useful in the devices of this invention include, without limitation, metals such as gold, platinum, palladium, tantalum, aluminum, molybdenum and chromium and salts there of such as, likewise without limitation, oxides, fluorides and nitrides.

As used herein, "diamond-like carbon," abbreviated "DLC" refers to the product obtained when a polymeric material is bombarded with high-energy ion beams. The bombardment results in the extrusion from the polymer of ions of elements other than carbon and the formation of a matrix of carbon-carbon bonds. A portion of the carbon-carbon bonds in the matrix are $sp^3$ or tetrahedral, i.e., they have the structure of diamond, hence the term diamond-like carbon. A portion of the carbon-carbon bonds in the matrix are $sp^2$ or double bond-like, which is akin to the structure of graphite. For the purposes of this invention, the polymeric material being bombarded to form DLC is an imaged resist. That is, it is the residual resist polymer that remains after the resist is exposed and developed. As used herein, DLC will refer to a matrix of carbon atoms comprising about 80% $sp^3$ carbons and about 20% $sp^2$ carbons. Such a matrix provides a very hard, abrasion and chemical-attack resistant surface. Depending on the desired properties of the resultant mask, a DLC matrix may be formed under conditions that result in residual unconverted resist polymer remaining entrapped in the matrix. The matrix may also be formed using conditions under which essentially all the polymer is converted to DLC but some of the ions liberated during DLC formation are entrapped in the matrix. In addition, a DLC matrix of this invention may be subjected to bombardment with a second ion source as the result of which some ions are implanted into the DLC. Such implanted ions are often referred to as dopants. Dopants can affect either or both of the energy-blocking and phase-shifting characteristics of the DLC. Examples, without limitation of ions with which a DLC layer may be doped include, without limitation, metal ions such as those of gold, silver, copper and aluminum and non-metals such as nitrogen, sulfur and silicon.

As used herein, a "glass" refers to a homogeneous, rigid material having a random, liquid-like, i.e., not crystalline, molecular structure. Examples of glasses include, without limitation, sodalime glass, borosilicate glass, white crown glass and fused quartz. In addition, some salts under high pressure become glass-like and are within the scope of a glass for the purposes of this invention. Such salts include calcium and magnesium fluorides.

As used herein, a "silicon membrane" refers to a very thin (approximately 100 nm) film of a silicon salt, such as, without limitation, silicon nitride, on which a pattern is superimposed using another metal, such as tungsten. In such case, the pattern is projected onto a wafer by accelerated electrons, the image contrast being produced by variable electron scattering and not by differential attenuation of the electron beam, that is, the mask does not absorb any electrons.

As used herein, "in register," when referring to the relationship between an edge of an energy-blocking substance layer and a DLC layer on a mask: the edges of the two layers align with one another in a plane essentially orthogonal to the plane of the transparent substrate.

As used herein, the phrase "lines of demarcation" simply refers to the lines between light-transmitting and light-blocking regions on a mask that define the edges of features being imaged.

By "recessed," as used herein when referring to relationship between the edges of a DLC layer and an energy-blocking layer, means that the energy-blocking layer is undercut relative to the DLC layer, the DLC layer forming a ledge extending out over the energy-blocking layer.

As used herein, "implanted," refers to accelerated ions that, because of their energy and the thickness of the layer of material that they contact, become entrapped in the material.

As used herein, "secondary ions" refers to ions used to bombard a layer of material already converted to DLC by an earlier high energy ion bombardment. In general, secondary ions are implanted in the DLC as opposed to passing through the layer as is preferred in the DLC formation procedure. Implanted secondary ions may confer a range of desirable characteristics on a DLC layer including, but not limited to, increased opacity to the type of energy being used and changes in the phase-shift of energy that is permitted to pass through the DLC layer.

As used herein, "shrink-control slots" refers to channels or trenches cut into a photoresist layer to compensate for the shrinkage that occurs upon bombardment with ions to form DLC. The shrinkage is caused by the collapse of carbon atoms into spaces formerly occupied by ions that have been extruded to form the DLC. The channels are cut essentially parallel to and within a short distance from the lines of demarcation between energy-transmitting and energy-blocking regions of the mask. The amount of full-thickness polymer remaining between the channel and the lines of demarcation is so small that the amount of shrinkage of that material is negligible and does not interfere with the resolution of the mask.

As used herein, "sub-resolution" refers to the width of the channels used as shrink-control slots, the width being sufficiently narrow that the selected energy being used is absorbed or diffused by the walls of the channel to the extent that any that does transmit through the mask does not have sufficient intensity to form an image on the surface of a wafer.

"Imaging system" refers to the type of energy being used to expose a wafer surface through a mask. Examples, without limitation, of imaging systems are optical (visible, uv, deep uv and extreme light) systems, electron beam projection systems, ion projections systems and proximity x-ray systems.

As used herein, the words, "about," "essentially" and "substantially" mean ±20%, preferably ±10%, most preferably ±1% from an absolute value, which may be express or implied. For example, "essentially parallel," when referring to a shrink-control slot means that the slot is, in any selected region, within ±20%, preferably ±10% and most preferably ±1% of parallel to the line of demarcation in that same region.

DISCUSSION

The following discussion is presented in terms of an optical photolithography imaging system. However, based on the disclosures herein, those skilled in the art will be able to adapt the techniques and materials described to construct masks for use with other imaging systems such as those mentioned above. Masks for those systems are within the scope of this invention.

FIG. 2 depicts a prior art binary mask. The mask consists of a quartz substrate 10 successively coated with a thin film of metallic chromium 20 at a thickness of from about 50 to about 150 nanometers and then with a layer of photoresist 30 at a thickness of from about 200 to about 1000 nanometers. An image of a geometry 40 eventually to be reproduced on a silicon wafer is then projected onto photoresist 30 as the result of which the chemical structure of photoresist 30 in regions that are exposed 50 is changed such that the unchanged photoresist in unexposed regions 60 can be selectively removed. As shown in FIG. 2B, the result is a relief representation of the original geometry. The chromium layer 20 that is revealed as the result of removal of photoresist in regions 60 is then etched away (FIG. 2C). Finally, the residual photoresist 50 is removed to give the original image reproduced in chromium on the quartz substrate (FIG. 2D).

FIG. 3 represents a binary photomask of this invention. The methods for carrying out the individual steps in creating such a photomask are well-known in the art (see, for instance Handbook of Semiconductor Manufacturing Technology, Marcel Dekker, Inc., 2000) and will not be described in detail. However, the steps have not heretofore been combined in such a manner to produce a photomask of the present invention. Thus, binary photomask precursor 140 is similar to, and constructed in essentially the same manner as prior art mask precursor 70 shown in FIG. 2B. That is, binary photomask precursor 140 is comprised of, first, energy-transparent substrate 100, which is constructed of a material that is transparent to the particular wavelength of energy being used, e.g., if the energy source is visible light, the transparent substrate may be, without limitation, soda lime glass, white crown glass, borosilicate glass, aluminosilicate glass, aluminosiliate glass or fused quartz. If the energy source is ultraviolet (UV) light, the transparent substrate is usually quartz. Energy transparent substrate 100 is coated with a layer of energy-blocking substance 110. The energy-blocking substance may be any material capable of partially or totally attenuating the energy source being used. When the energy source is visible or UV light, materials such as, without limitation, sputtered metals, metal salts such as oxides, nitrides and fluorides and combinations thereof may be used. A presently preferred energy-blocking substance is metallic chromium which may optionally be combined with other metals or metal salts such as, without limitation, metallic molybdenum, aluminum or silver and salts thereof. When the energy source is x-rays, materials such as, without limitation, gold, tantalum, tantalum silicide (TaSi) or tungsten thallium alloy (W—Tl) may be used. Energy-blocking substance 110 is in turn coated with a photoresist that may be a positive or a negative photoresist. That is, with a positive photoresist, upon exposure to a light source, the photoresist is rendered selectively removable where the original image was clear and with a negative photoresist, the photoresist is rendered selectively removable where the original image was opaque. For purposes of description herein, a negative photoresist will be assumed although it is understood that a positive photoresist could be used as well and is within the scope of this invention. An image of a geometry to be reproduced on a wafer is then projected onto the photoresist. The mask is developed using standard techniques to selectively remove photoresist in unexposed region(s) 120 leaving exposed regions 130 of photoresist intact. The result is binary mask precursor 140. Binary mask precursor 140 is then bombarded with high energy ions 150 that convert residual photoresist 130 to DLC 160. The energy of ions 150 is selected such that substantially all ions pass completely through photoresist 130. This results in the formation of a strong bond between the DLC formed and energy-blocking substance 110. Depending on their type and energy, the ions may stop in energy-blocking substance 100, in energy-transparent substrate 110 or they may pass completely through mask 140 as represented by the lower case x's in FIG. 3C. Ions such as, without limitation, argon, neon, fluoride, chloride, carbon and aluminum, which have been accelerated to energies of from 75 ev to about 10 Mev may be used to convert photoresist 130 to DLC. The opacity (or, conversely, the transmissivity) of DLC 160 is independent of the type of ions used, their energy or the time of bombardment. Rather, the maximum opacity (minimum transmissivity) achievable is determined by the choice of photoresist and the thickness of the layer. If the maximum opacity achieved with a particular photoresist at a particular thickness is sufficient for the intended use, mask 170 can then be subjected to the next step in process, removal of energy-blocking substance 110 from regions of the mask where it is no longer protected by a DLC layer. If, on the other hand, greater opacity is required, mask 170 can be further bombarded with a second ion source that is accelerated to an energy that will result in substantially all the ions being implanted in DLC layer 160, as shown in FIG. 3C in which the lower case z's represent implanted ions. The energy-blocking substance can then be removed from the regions not protected by DLC 160 and mask 180 is ready for use.

Figure 3A:
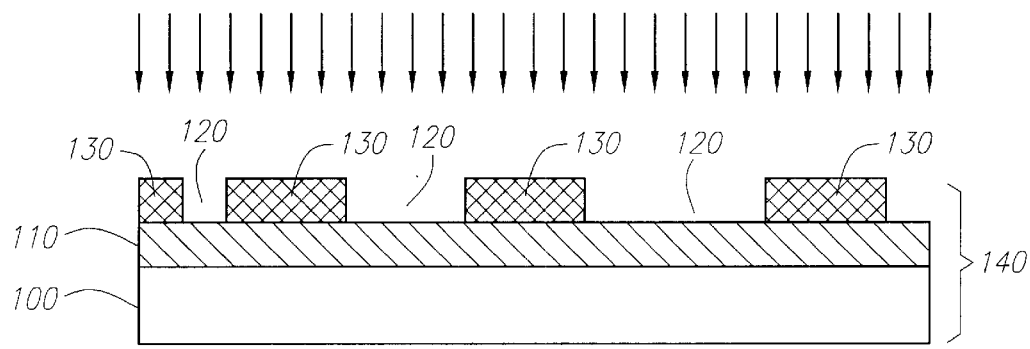
FIG. 3 is a schematic representation of a binary mask of the present invention in which an energy-blocking layer is over-coated with a diamond-like carbon layer, the edges of the two layers being in register so that they together define the edges of a geometry being reproduced.
Figure 3B:
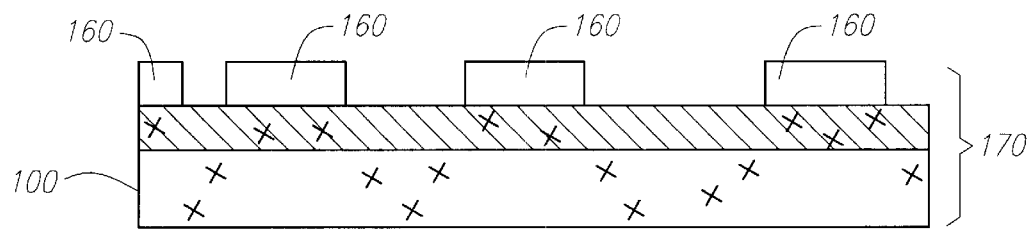
Figure 3C:
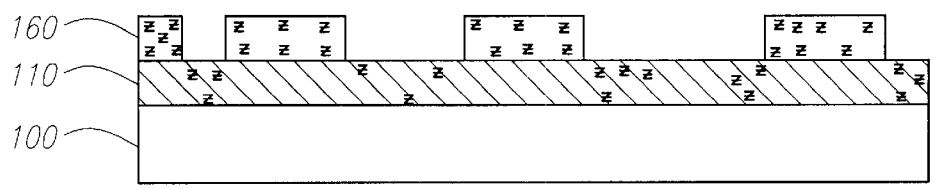
Figure 3D:
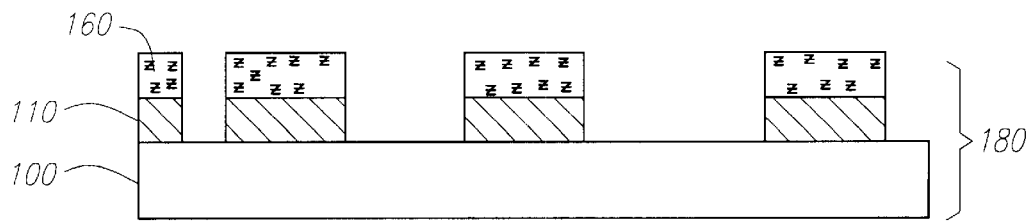

Removing the energy-blocking substance from regions where it is not protected by DLC can be performed such that two variations on a mask of this invention can be produced. The energy-blocking substance can be removed in such a manner that edges of the remaining energy-blocking substance are in register with the edges of the DLC, as shown in FIG. 3D. In this case, the transmissivity of the DLC and the energy blocking layers can vary substantially, the only criterion being that, combined, the two layers are essentially opaque in the energy blocking regions of the mask.

Figure 4:
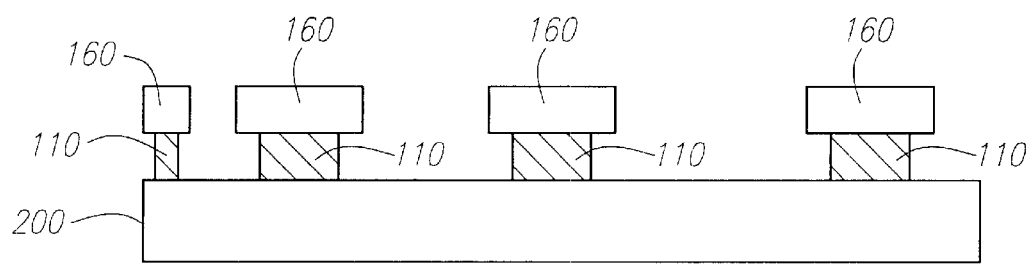
FIG. 4 is a schematic representation of a binary photomask of this invention in which the edges of an energy-blocking layer undercut a DLC layer which defines the edges of a geometry being reproduced.
Figure 5A:
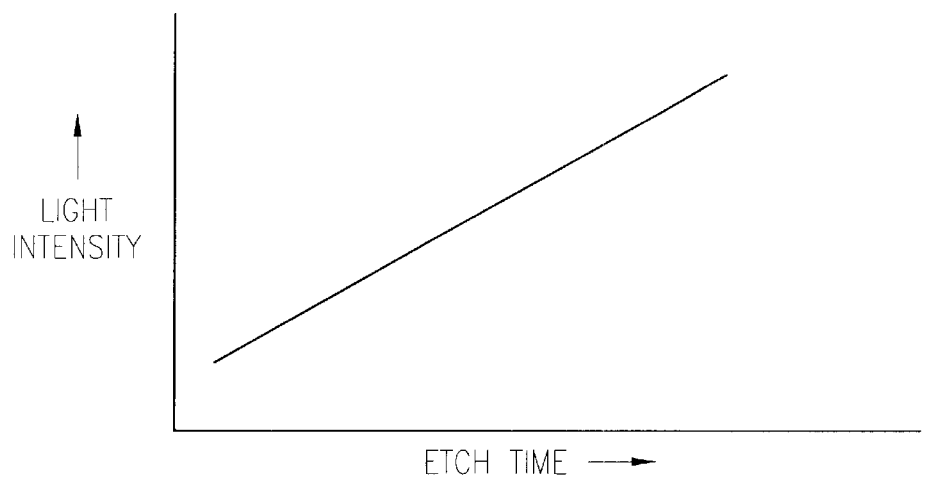
FIG. 5A showing line width variation as light intensity versus time of etch in a prior art mask and FIG. 5B showing line width as light intensity versus time of etch in a mask of this invention.
Figure 5B:
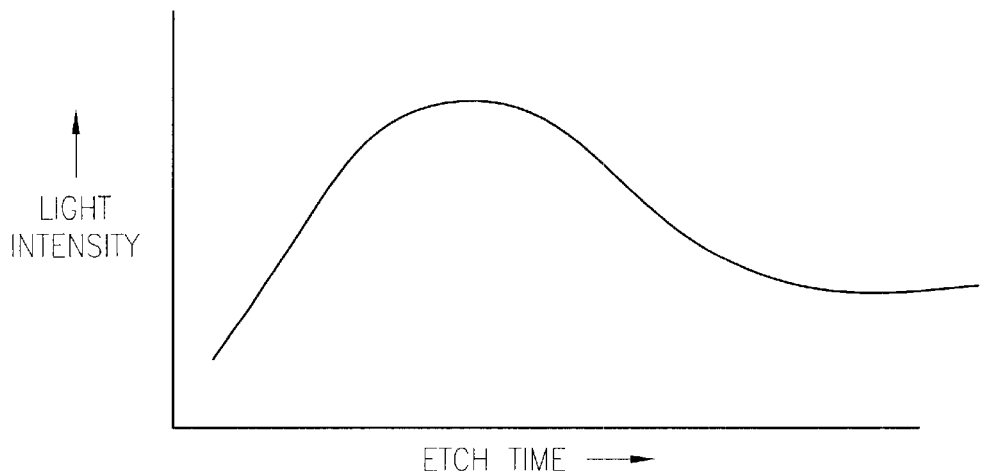
FIG. 5 depicts two graphs.

In a presently preferred embodiment of this invention, however, it is necessary that the DLC layer in and of itself be essentially opaque either as the natural result of the formation of the DLC or as the result of subsequent bombardment with secondary ions. In this embodiment, removal of energy-blocking substance 110 is continued until it undercuts the DLC layer 160 as shown in FIG. 4. In this manner, the edges of DLC 160 define the edges of the geometry being reproduced. This gives a photomask that has superior characteristics in terms of line width control and MEF. That is, in prior art masks, line width increases linearly with etching time (FIG. 5A). However, it has been found that increasing the etch time when forming a mask of this invention, that is, a mask having a DLC layer over an energy blocking substance layer, results in a mask in which line width actually decreases with etch time (FIG. 5B). Furthermore, it has been found that over-etching the energy-blocking substance, so that the edges of the geometry being imaged are defined by the edges of the DLC, also results in a reduced MEF.

Figure 6A:
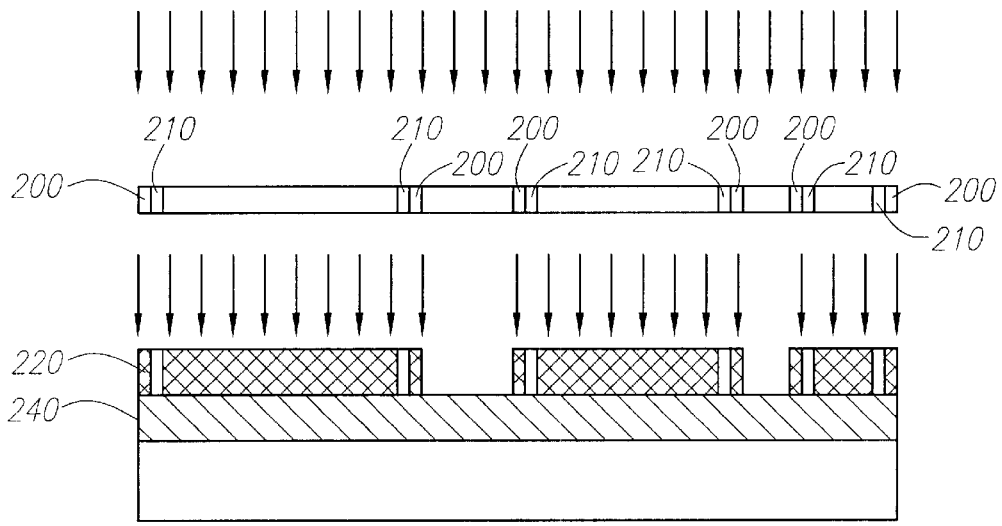
FIG. 6 is a schematic representation of a mask of this invention that includes shrink control slots.
Figure 6B:
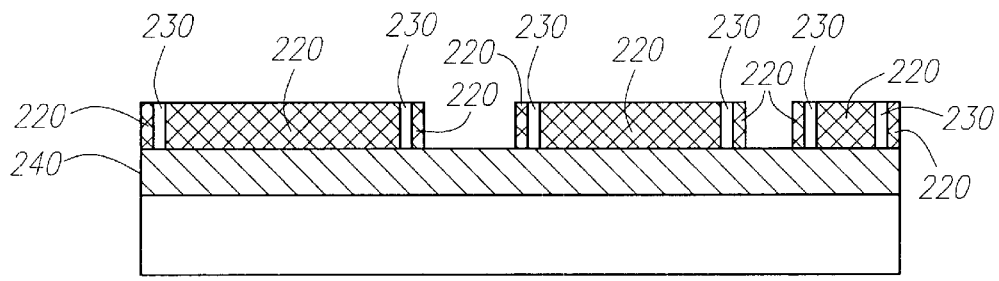
Figure 6C:
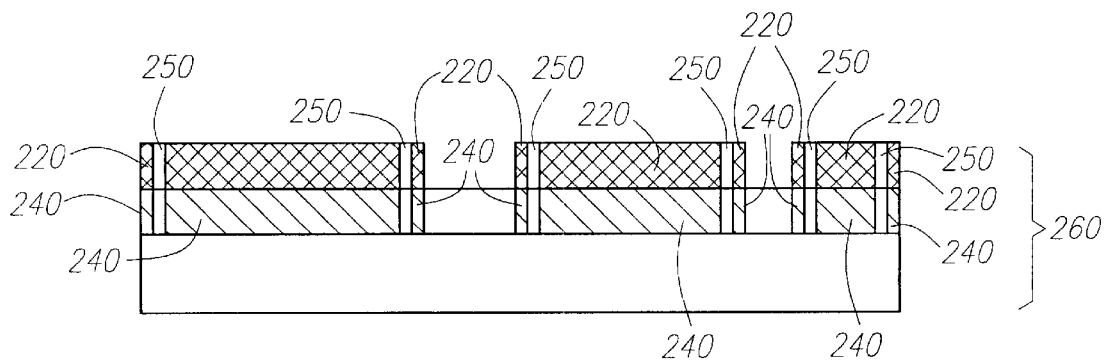

In a further presently preferred embodiment of this invention, image 200 projected on the photoresist layer 220 has an added feature comprising a fine line 210 that parallels the edges of the energy-blocking region of the geometry being produced. When the mask is developed, this results in the formation of narrow trenches 230 in photoresist 220 as shown in FIG. 6B. The trenches relieve shrinkage that occurs as the photoresist is converted to DLC as the result of expulsion of ions from the photoresist polymer. That is, when there is a large mass of photoresist being converted to DLC, the amount of shrinkage is relatively large and the edges of the DLC can pull away from the line that corresponds to the original geometry. Incorporation of trench 230 results in two separate areas of shrinkage, the one closest to the line corresponding to the dimension of the actual geometry being very small. Only a small amount of photoresist will be converted to DLC in that region and the resulting horizontal shrinkage will be insignificant. Energy-blocking substance 240 can then be removed from the precursor mask to form binary mask 260. The width of the trenches are such that either a) the depth of the trench is less than the thickness of the converted DLC preventing the energy-blocking substance 240 from being removed, or b) the patterned trenches are sub-resolution with regard to the energy source being used. That is, insufficient energy will be able to navigate through the mask in the regions of the trenches to cause an exposure on a target wafer. The determination of acceptable trench widths for a particular wavelength light is within the capability of those skilled in the art based on the disclosures herein.

Figure 7:
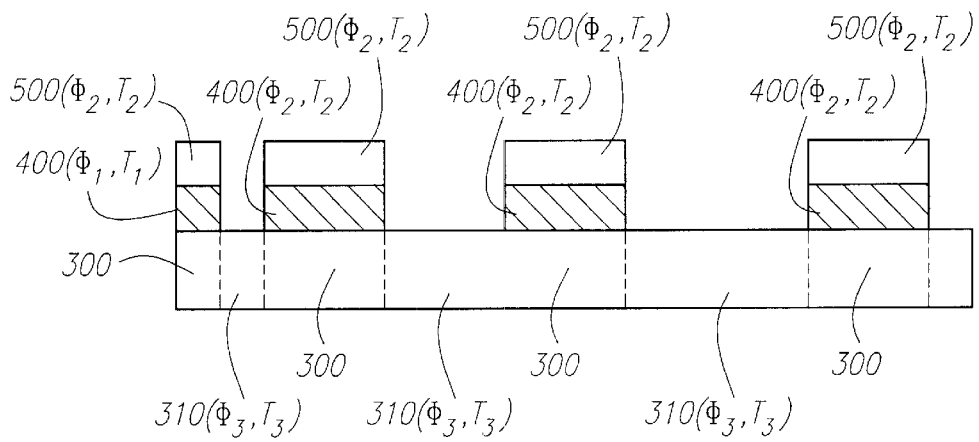
FIG. 7 is a schematic representation of a phase-shift mask of this invention in which the edges of an energy-blocking layer are in register with the edges of a DLC layer.

FIG. 7 represents a phase-shift photomask of the present invention. Phase-shift photomask 320 is, similarly to the other masks of this invention, produced by step-wise processes known in the art. That is, phase-shift mask 320 results from the successive coating of energy-transparent substrate 300 with energy-blocking substance 400 and a photoresist. When energy-blocking substance 400 is chromium, its thickness is preferably from about 50 to about 150 nm. The thickness of the photoresist layer is preferably about 200 to about 1000 nm. The photoresist layer is exposed and developed using techniques known in the art. The photoresist layer is then bombarded with high energy ions to convert the residual photoresist to DLC 500. Once DLC 500 has been formed, energy-blocking substance 400 is removed until the edges of remaining energy blocking substance 400 are in register with the edges of DLC 500 as shown in FIG. 7. Energy-blocking substance 400 and DLC 500 are independently capable of transmitting from about 0% to about 100% of the energy incident on them and are independently capable of phase-shifting energy that passes through them from about 0° to about 360°. That is, in FIG. 7, energy-blocking substance 400 is shown as having transmissivity $T_1$ and phase-shifting characteristic $\Phi_1$ and DLC layer 500 is shown as having transmissivity $T_2$ and phase-shifting characteristic $\Phi_2$. As noted previously, the transmissivity and phase-shifting characteristics of a DLC layer can be varied by varying the composition of the photoresist polymer which is converted to DLC, the thickness of the DLC layer and by secondary implantation into the DLC layer. With regard to thickness, the thickness required to achieve a 180° phase-shift can be determined using the following equation $$T = \frac{i\lambda}{2(n-1)} \qquad \text{Eq. 1}$$

T is the thickness of the phase-shifting material
i is a positive odd integer
$\lambda$ is the wavelength of the incident light
n is the refractive index of the phase-shifting material The thickness of the DLC layer can be controlled by controlling the application thickness of the photoresist used or it may be controlled by plasma etching of the DLC layer once formed. Techniques for coating photoresist at exact thicknesses and for plasma etching the DLC are known in the art.

In a similar manner, the transmissivity and phase-shifting characteristic of the energy-blocking substance can be varied by controlling the composition of the substance, e.g., without limitation, using chromium alone or a chromium/molybdenum silicide composite, by controlling its thickness and, if desired, by secondary ion implantation.

While the transmissivity of the DLC and the energy-blocking substance may independently range from about 0% to about 100%, combined they preferably result in an overall transmissivity of from about 4% to about 80%.

Shrink control slots may also be included in a PSM of this invention. They are formed in the same manner and have the same characteristics as those described above in relation to binary masks.

Even greater control over the relative phase-shift characteristics of a PSM of this invention can be achieved by implanting secondary ions into the energy-transparent substrate in addition to, or instead of, secondary ion implantation into the DLC and/or the energy-blocking substance. Examples of energy transparent substrates that are useful with masks where the energy source is visible light or UV light and which may be implanted with secondary ions are, without limitation, fused quartz, fused calcium fluoride and fused magnesium fluoride. This is depicted in FIG. 7 wherein regions of the energy transparent substance not protected by an energy-blocking/DLC layer (regions 310) are shown as having transmissivity $T_3$ and phase-shifting characteristic $\Phi_3$)

Figure 8:
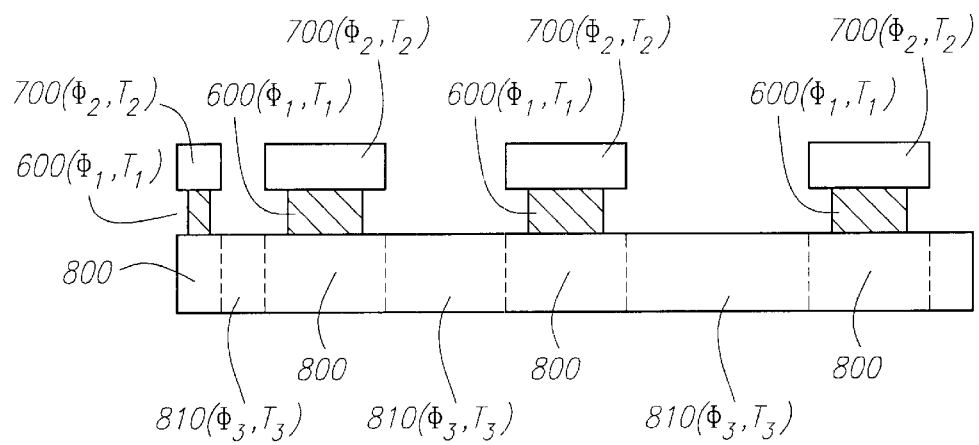
FIG. 8 is a schematic representation of a phase-shift mask of this invention in which the edges of an energy-blocking layer undercut a DLC layer.

A still further PSM construct within the scope of this invention is one which has the same characteristics as that described above but one in which, as in the presently preferred embodiment of a binary mask, energy-blocking substance 600 is removed until it undercuts DLC layer 700, as shown in FIG. 8. In contrast to the preferred embodiment of the binary mask wherein DLC 160 (FIG. 4) that overhangs energy-blocking substance 110 is essentially opaque, DLC 700 of PSM 900 of this invention still permits some energy to pass through. This energy is then phase-shifted as determined by the wavelength of the energy being used, the thickness of DLC 700 and its refractive index (RI), which may either be its natural RI or it may an augmented RI resulting from secondary ion implantation. A presently preferred tranmissivity for the DLC of a PSM of this invention is from about 4% to about 100%, most preferably from about 4% to about 8%. A presently preferred phase shift effected by a DLC layer of this invention is a 180° shift compared to the light passing through adjacent energy transparent substrate. And, of course, an energy-blocking layer 600 having a transmissivity and a phase-shifting characteristic different than DLC 700, if desired, is also within the scope of this invention.

It is clear from the above description of a PSM of this invention that transmissivity of any region of the mask is effectively independent of phase shift. This stands in contrast to prior art PSMs in which, if a particular phase-shift was desired, a particular thickness of a phase-shifting material of known RI had to be used. For example, if a 180° phase shift was desired, the required thickness of the phase-shifting layer would be calculated using Eq. 1, above. However, that thickness might not provide a layer with the desired degree of transmissivity which created a problem. The masks of the present invention do not suffer from this problem in that both the DLC and the energy-blocking substance can have virtually any desired transmissivity and concurrent phase-shifting characteristic. As noted above, even greater control over phase shift in a mask of this invention can be obtained by implanting secondary ions, which may be the same or different from those implanted in DLC layer 700 and/or energy-blocking substance 600, into transparent substrate 800 as shown in FIG. 8.

Thus, the transmissivity and phase-shift of any region of a mask of this invention can be independently manipulated to afford a previously unattainable degree of control over the characteristics of the mask. That is, as shown in FIG. 8, a mask can be produced having a DLC layer 700 with transmissivity $T_2$, wherein $T_2$ can be at any desired transmissivity from 0% (completely opaque) to 100% (completely transparent), and phase-shift characteristic $\Phi_2$, wherein $\Phi_2$ can be left at its nominal value or $\Phi_2$ can be altered to virtually any value from essentially 0° to essentially 360° by secondary ion implantation. Likewise, the tranmissivity $T_1$ of energy-blocking substance 600 can be varied from 0% to 100% and its phase-shifting characteristic $\Phi_1$ from essentially 0° to essentially 360°. Furthermore, the phase-shifting characteristic $\Phi_3$ of an energy-transparent substrate 810 can be altered by implantation of secondary ions. Thus, a PSM of this invention can have virtually any T and any $\Phi$ in any region of the mask.

A PSM of this invention may also contain shrink control slots which are the same as those described above in reference to a binary photomask.

Figure 9:
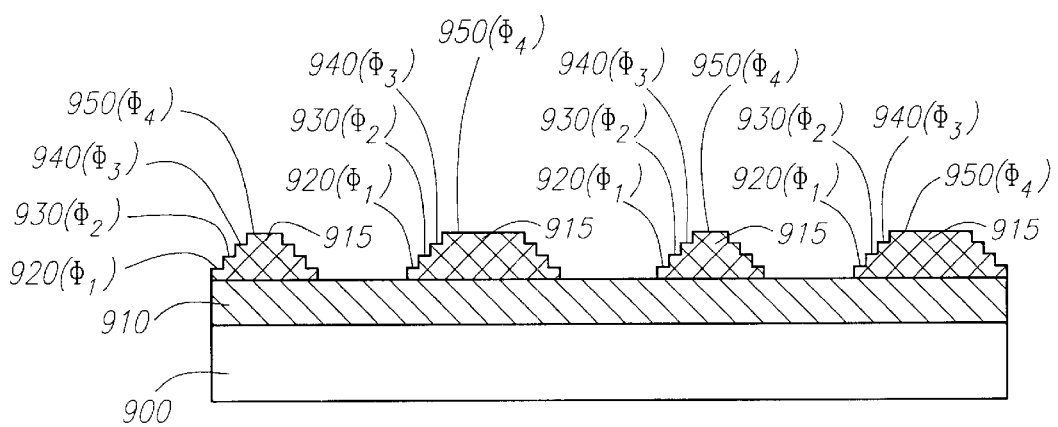
FIG. 9 is a schematic representation of a phase-shift mask of this invention in which the DLC layer has been manipulated to create a step-like structure.

The complete control over transmissivity and phase shift of various regions of a mask of this invention can be carried a step further. FIG. 9 depicts a mask of this invention in which the DLC layer 915 has been appropriately exposed and developed prior to converting the photoresist to DLC or has been plasma-etched to give a stepped structure. The thickness of each step will determine the phase shift of energy passing through that step as shown. In the example depicted in FIG. 9, the DLC layer has been stepped to create four discrete steps, i.e., steps 920, 930, 940 and 950. DLC layer 915 is shown in this manner for purposes of description only and the number of steps may be greater or fewer than those shown. In this manner, phase shifts other than 180° can be created in a mask. The ability to control phase shift in this manner permits making incremental changes in the phase shift between 0 and 180 degrees instead of a single 180 degree step.

CONCLUSION

Thus, it will be appreciated that the present invention provides lithography masks, in particular photolithography masks, of tremendous versatility in they offer virtually limitless variation in transmissivity and phase-shift over the entire surface of the mask. Furthermore, while offering these advantages, they simultaneously provide increased control over geometry dimensions, e.g., line width, and a reduced mask error factor.

Although certain embodiments and examples have been used to describe the present invention, it will be apparent to those skilled in the art that changes in the embodiments and examples shown may be made without departing from the scope of this invention.

Other embodiments are within the following claims.

What is claimed is:

1. A binary mask having energy-transmitting regions and energy-blocking regions, comprising:
    an energy-transparent substrate;
    an energy-blocking substance adhered to the substrate in the energy-blocking regions; and,
    diamond-like carbon (DLC) adhered to the energy-blocking substance.

2. The binary mask of claim 1, wherein said energy is visible light, uv light or x-ray energy.

3. The binary mask of claim 2, wherein said energy-transparent substrate comprises a glass.

4. The binary mask of claim 3, wherein said glass is quartz.

5. The binary mask of claim 2, wherein said energy-blocking substance comprises a metal, a metal oxide, a metal nitride or a metal fluoride.

6. The binary mask of claim 5, wherein said energy-blocking substance comprises chromium.

7. The binary mask of claim 6, wherein said energy-blocking substance further comprises molybdenum, molybdenum oxide or molybdenum nitride.

8. The binary mask of claim 1, wherein said energy is accelerated electrons.

9. The binary mask of claim 8, wherein the energy-transparent substrate comprises a silicon membrane.

10. The binary mask of claim 1, wherein edges of the energy-blocking substance and edges of the DLC are in register and together provide lines of demarcation between the energy-transmitting regions and the energy-blocking regions of the mask.

11. The binary mask of claim 1, wherein edges of the DLC provide lines of demarcation between the energy-transmitting and the energy-blocking regions, edges of the energy-blocking substance being recessed relative to the edges of said DLC.

12. The binary mask of claim 11, wherein the DLC comprises implanted secondary ions.

13. The binary mask of either claim 10 or claim 11, wherein the DLC further comprises shrink-control slots that are sub-resolution to the imaging system being used, the shrink-control slots being located in the DLC essentially parallel to the lines of demarcation between energy-transmitting and energy-blocking regions of the mask.

14. A phase-shift mask having energy-transmitting regions and energy-blocking regions, comprising:
    an energy-transparent substrate;
    a first energy-blocking substance adhered to said substrate in said energy-blocking regions;
    a second energy-blocking substance adhered to said first energy-blocking substance; wherein,
        edges of the first and the second energy-blocking substances are in register and together provide lines of demarcation between the energy-transmitting the energy-blocking regions of the mask;
        the first and the second energy-blocking substances independently transmit from about 0% to about 100% of energy incident on them and independently phase-shift energy that does pass through them from about 0° to about 360° relative to energy passing through the energy-transmitting regions of the mask; and,
    combined, the first and the second energy-blocking substances transmit from about 4% to about 60% of energy incident on them and phase-shift energy that does pass through them from about 0° to about 360° relative to energy passing through the energy-transmitting regions of the mask.

15. The phase-shift mask of claim 14, wherein the first energy-blocking substance comprises chromium.

16. The phase-shift mask of claim 14, wherein the second energy-blocking substance comprises diamond-like carbon (DLC).

17. The phase-shift mask of claim 16, wherein the DLC further comprises shrink-control slots that are sub-resolution to an imaging system being used and are located in the DLC essentially parallel to the lines of demarcation between energy-transmitting and energy-blocking regions of the mask.

18. The phase-shift mask of claim 14, further comprising ion-implantation of the substrate in the transparent regions of the mask, the ion-implanted substrate phase-shifting energy passing through it from about 0° to about 360° relative to energy passing through the combination of the first and second energy-blocking substances.

19. The phase-shift mask of claim 18, wherein the ion-implanted substrate phase-shifts energy passing through it about 180° relative to energy passing through the combination of the first and second energy-blocking substances.

20. The phase-shift mask of claim 18, wherein the ion-implanted substrate comprises ion-implanted quartz, ion-implanted calcium fluoride or ion-implanted magnesium fluoride.

21. A phase-shift mask having energy-transmitting regions and energy-blocking regions, comprising:
    an energy-transparent substrate;
    a first energy-blocking substance adhered to said substrate in said energy-blocking regions;
    a second energy-blocking substance adhered to said first energy-blocking substance; wherein,
        edges of the second energy-blocking substance provide lines of demarcation between the energy-transmitting the energy-blocking regions of the mask, edges of the first energy-blocking substance being recessed relative to the edges of the second energy-blocking substance;
        the first energy-blocking Substance transmits from about 0% to about 100% of light incident on it;
        the second energy-blocking substance transmits from about 4% to about 100% of the energy incident on it and phase-shifts energy that does pass through from about 0° to about 360° relative to energy passing through the energy-transmitting region of the mask.

22. The phase-shift mask of claim 21, wherein the second energy-blocking substance comprises diamond-like carbon (DLC).

23. The phase-shift mask of claim 22, wherein the DLC comprises secondary ion-planted DLC.

24. The phase-shift mask of claim 22, wherein the DLC comprises shrink-control slots that are sub-resolution to an imaging system being used and are located in the DLC essentially parallel to the lines of demarcation between energy-transmitting and energy-blocking regions of the mask.

25. The phase-shift mask of either claim 14 or claim 21, wherein phase-shift increases as it passes through the secondary energy-blocking regions with increasing distance from lines of demarcation.

26. The phase-shift mask of claim 25, wherein said phase-shift increase occurs in stepped fashion.

27. The phase-shift mask of claim 25, wherein the thickness of the second energy-blocking region increases with distance from lines of demarcation.

28. The phase-shift mask of claim 25, wherein the second energy blocking substance comprises diamond-like carbon (DLC).

* * * * *